United States Patent [19]

Rogers et al.

[11] Patent Number: 5,068,007
[45] Date of Patent: Nov. 26, 1991

[54] ETCHING OF MATERIALS IN A NONCORROSIVE ENVIRONMENT

[75] Inventors: Stephen P. Rogers, Mesa; Michael S. Lebby, Chandler, both of Ariz.

[73] Assignee: Motorola Inc., Schaumburg, Ill.

[21] Appl. No.: 587,143

[22] Filed: Sep. 24, 1990

[51] Int. Cl.$^5$ .................. H01L 21/306; B44C 1/22; C23F 1/00
[52] U.S. Cl. .................. 156/643; 156/646; 156/656; 156/657; 156/662; 156/665; 204/192.35; 204/192.37; 437/234; 437/245
[58] Field of Search ............... 252/79.1; 156/643, 646, 156/656, 657, 659.1, 662, 664, 665; 204/192.32, 192.35, 192.37; 437/234, 245

[56] References Cited

U.S. PATENT DOCUMENTS 4,671,847  6/1987  Clawson .................. 156/635
4,925,813  5/1990  Autier et al. .................. 156/643 X Primary Examiner—William A. Powell
Attorney, Agent, or Firm—Joe E. Barbee

[57] ABSTRACT

A method for plasma etching semiconducting composed of III-V and related materials is provided. Enhanced removal rates, greater volatility, and reduced etch initiation time is provided by exposing the semiconductor to a plasma of methane, hydrogen, and at least one of trialkylboron, trimethylboron, or triethylboron.

16 Claims, 1 Drawing Sheet

ETCHING OF MATERIALS IN A NONCORROSIVE ENVIRONMENT

BACKGROUND OF THE INVENTION

This invention relates, in general, to plasma etching of semiconductor substrates, and more particularly to plasma etching of III-V and related materials.

Etching of metals and metalloids has been accomplished for some time by using halogen based plasma chemistries, and more specifically chlorine and fluorine based plasma chemistries have been used. Metalloids are elements in the Periodic Chart found in groups III and V that have been combined to form compounds, or alloys with properties intermediate to those of typical metals and nonmetals, called semimetal or metalloids. Chlorine based plasma chemistries have been preferred to etch these III-V materials. Even though the use of chlorine based chemistries has been somewhat successful at etching these materials, there are still many difficult problems.

For example, chlorine chemistries corrode interconnect lines that are used to route information from one transistor or semiconductor device to another. Interconnect lines are usually formed by metals that are composed of aluminum, an aluminum alloy, or the like. During the etching of these interconnects a trace amount of residual chlorine may be left on the metal lines and surrounding areas. When the etching process is complete and the interconnect lines which are built on a semiconductor substrate are removed from the plasma etch chemistry, the residual chlorine that is left on the substrate is then free to react with the environment. The environment generally has some amount of moisture or humidity which will react with the residual chlorine to produce hydrochloric acid. The hydrochloric acid then continues to indiscriminately etch the metal interconnect lines. This etching process continues until either chlorine, moisture or metal is exhausted.

Many processes have been developed to help reduce levels of residual chlorine left on the semiconductor device after plasma etching. While these processes have had some beneficial effects in reducing corrosion. They have not, however, resolved the problem totally.

Metals and III-V materials have always been difficult to etch. Etching of III-V materials have been commonly achieved in chlorine based plasma chemistries as written about by E. L. Hu and R. E. Howard, "Reactive-Ion etching of GaAs and InP using $CCl_2F_2$/Ar/$O_2$", Applied Physics Letters, 37(11), page 1022 (1980). Etching of metals and III-V materials is usually achieved in chlorine based plasma chemistries which commonly use low pressure and high physical bombardment levels to achieve removal of material. It has been know for a long time that etch products of metals and III-V materials with the use of chlorine based chemistries have a low volatility. This low volatility of etch products has caused problems in etching of these materials such as slow etch rates, residual material, inadequate masking structures, or the like.

Etching metal and metalloids in a plasma composed of methane ($CH_4$) and hydrogen ($H_2$) specifically for III-V semiconductor materials was first demonstrated by U. Niggebrugge, et. al., "GaAs and Related Compounds", Inst. Phys. Conf. Ser. No 79, Karuizawa, Japan, (1985) pp. 367-372. The use of methane and hydrogen chemistries for etching III-V materials has been shown to be feasible, but problems still persist such as low etch rates, due to competing plasma enhancement chemical vapor deposition, and etch initiation is being slow.

It can be seen that conventional plasma etch processing techniques involving chlorine chemistries are not adequate for etching III-V metalloids and related materials. Low volatility of etch products retards the etch rates of these materials. Corrosion plays a major role in yield, device performance, packaging, reliability and life times of devices that are manufactured by dry plasma etching. Therefore, a method that would remove corrosion as a problem and increase volatility of etch products would be highly desirable.

SUMMARY OF THE INVENTION

The objects and advantages of the present invention are provided by a method for etching a semiconductor and related materials by exposing the semiconductor substrate in a plasma reactor to a novel gas etchant. The semiconductor substrate is exposed to a gaseous plasma containing methane, hydrogen, and trialkylboron.

DETAILED DESCRIPTION OF THE DRAWINGS

Figure 1:
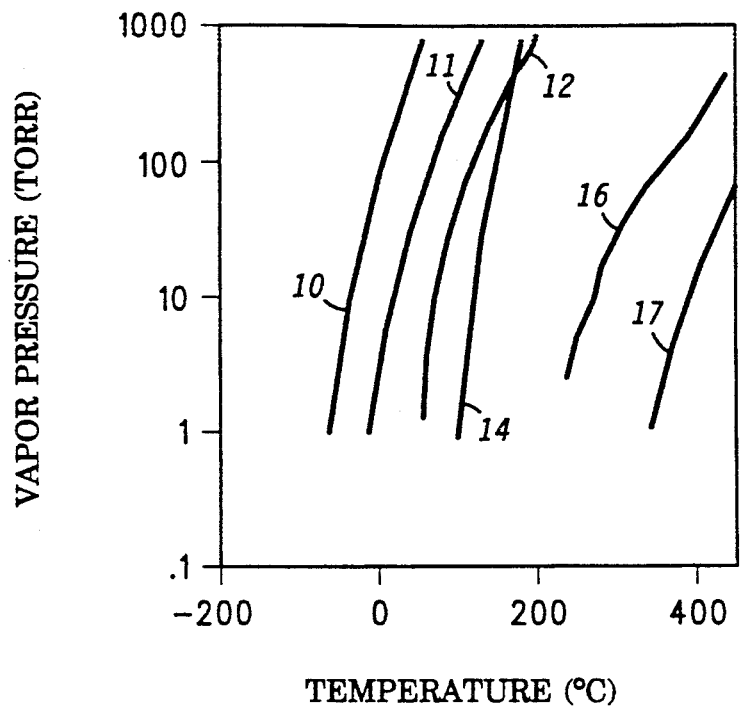
FIG. 1 is a graph of vapor pressure versus temperature for common chlorine etch products.

FIG. 1 is a graph of vapor pressures versus temperature curves for chlorine etch products. Volatility is a tendency of a solid or liquid material to pass into a vapor phase at a relatively low temperature. A more volatile material develops a vapor pressure at lower temperatures than a less volatile material. Therefore, higher volatility occurs at a higher vapor pressure for a given temperature. Plotting of vapor pressure versus temperature yields an Arrhenius type of curve that is characteristic of that particular material for those two parameters. Use of these curves allows for a comparison of volatility of different materials. Plasma etching of III-V and related materials is conventionally achieved in chlorine plasma chemistry. Generally, a plasma is created in a reactor that consists of an evacuated chamber, a means for introducing a suitable gas or gases into the chamber, and a means for applying a modulated frequency field to that chamber so that a glow discharge occurs. At least one semiconductor wafer substrate is inserted into the plasma or in close proximity to the plasma. These substrates contain in part or in whole, materials that are desired to be etched away. Common reactor types for accomplishing this reaction are barrel reactors, magnetron reactors, electron cyclotron systems, reactive ion etch reactors, or the like. It should be understood that other reactor types can be used for the practice of this invention such as parallel plate reactors, down stream reactors, or the like. When a high frequency voltage is applied to a gas contained in a chamber, the gas ionizes and a glow discharge or plasma occurs. The ionized gas is comprised of a partially ionized gas with equal numbers of positive and negative charges, and a different amount of unionized neutral molecules. The plasma also contains a population of free radicals. Free radicals are atoms or molecules that are electrically neutral but, exhibit incomplete chemical bonding, thus making the free radical a highly reactive species. It is believed that these highly reactive free radical species are mainly responsible for chemical etching of materials in a plasma etch reactor.

Reactions in the plasma itself are very complicated but, basic mechanisms can be represented by a generalized formula:

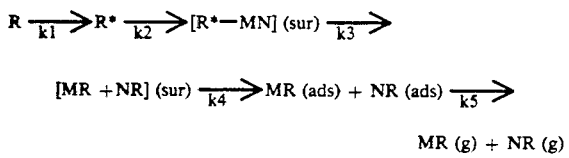

$$R \xrightarrow{k_1} R^* \xrightarrow{k_2} [R^* - MN] \text{(sur)} \xrightarrow{k_3}$$

$$[MR + NR] \text{(sur)} \xrightarrow{k_4} MR \text{(ads)} + NR \text{(ads)} \xrightarrow{k_5}$$

$$MR \text{(g)} + NR \text{(g)}$$

$k_1$ = rate constant for generation of etch species
$k_2$ = combined diffusion and chemisorption rate constant
$k_3$ = chemical reaction rate constant
$k_4$ = physisorption rate constant
$k_5$ = diffusion rate constant for etch products to be removed
R = gaseous etch species
R* = activated etch species formed in plasma
MN = substrate to be etched
MR = etch product component one
NR = etch product component two.

From this formula several generalities can be drawn.

First, generation of free radicals or etch species R* must be formed from a gas or gases R in the plasma. Generation of reactive etch species R* from gaseous etch species is indicated by $k_1$. Reactive species may be free radicals, ions or neutrals. The etch species must be continually replaced or formed in the plasma. The formation of etch species in the plasma is represented by R*. If etch species R* is not continuously formed in the plasma, the reaction becomes reactant starved and eventually stops.

Second, etch species R* must travel from the plasma to the surface of the substrate that is to be etched. This diffusion from the plasma to the surface of the substrate that is to be etched, and is included as part of rate constant $k_2$.

Third, once the etch species have diffused to the surface (sur) they can be chemisorped onto surface MN. Chemisorption is a binding energy which usually leads to formation of new bonds. Chemisorption is also part of rate constant $k_2$. Substrate surface that is illustrated in the generalized formula is represented as MN. MN is composed of two elements. These two elements could be gallium arsenide, or indium phosphide, or the like. It should also be understood that other materials such as gallium phosphide, indium gallium aluminum phosphide, indium gallium aluminum arsenide, indium aluminum antimonide, aluminum, silicon, or any combination thereof or the like could be used.

Fourth, a chemical reaction takes place between the adsorbed etch species R* and the substrate MN. This chemical reaction is indicated by chemical reaction rate constant $k_3$. It is at this point that chemical bonds are changing to form etch products.

Fifth, etch products MR and NR are now fully formed. Etch products are an end result of a chemical reaction. It is these etch by-products that are to be exhausted away from the substrate. These products are held closely to the surface by physisorption forces, which must be overcome, at a rate constant indicated by $k_4$. Physisorption forces are effects caused by electrical interactions between two bodies such as van der Waals forces or the like. Opposing these attractive forces are other forces such as volatility or the like. A more volatile etch product overcomes the electrical forces and is removed more quickly from the surface than a less volatile etch product.

Reactions $k_2$, $k_3$, and $k_4$ are chemical transitional states between initial contact of etch species R* and substrate MN, and etch products MR, and NR. These transitional states occur very quickly and are very difficult to measure.

Sixth, etch products are diffused into the plasma itself and are exhausted away. This ability to be removed from the surface and to form a volatile gaseous etch product species is indicated by diffusion rate constant $k_5$. It should be evident that a more volatile etch product species is removed more easily than a less volatile etch product species.

In general, FIG. 1 is a graph of vapor pressure versus temperature curves for common etch products using chlorine etch chemistry. Etching of arsenic, indium, aluminum, and silicon in chlorine chemistries yields major etch products of which their vapor pressures versus temperature curves are shown in FIG. 1. These etch products are arsenic trichloride represented by curve 11, indium trichloride represented by curve 17, aluminum trichloride represented by curve 14, and silicon tetrachloride represented by curve 10 respectively. Chlorine etching of gallium however has two major etch product components which are shown as gallium trichloride represented by curve 12 and gallium dichloride represented by curve 16 in FIG. 1. It should be understood that etching of materials such as gallium arsenide have been separated and are represented as single etch product. Using one torr as a standard vapor pressure to examine relative vapor pressures of all the etch products shown, it can be seen that more volatile etch products are on the left hand side of the graph whereas, lower volatility etch products are on the right hand side. This graph illustrates the difficulty in generating volatile etch products using chlorine based chemistry. For example, when etching aluminum with chlorine chemistries, a major etch product is aluminum trichloride represented by curve 14. In order to obtain a one torr vapor pressure of aluminum trichloride, a temperature of approximately 100 degrees Celsius is necessary. This low volatility of etch product species decreases an ability to remove or etch aluminum. Since vapor pressure versus temperature curve for indium trichloride, represented by curve 17, is found on the extreme right hand side of FIG. 1, it indicates that etching of indium and indium containing compounds is very difficult.

Figure 2:
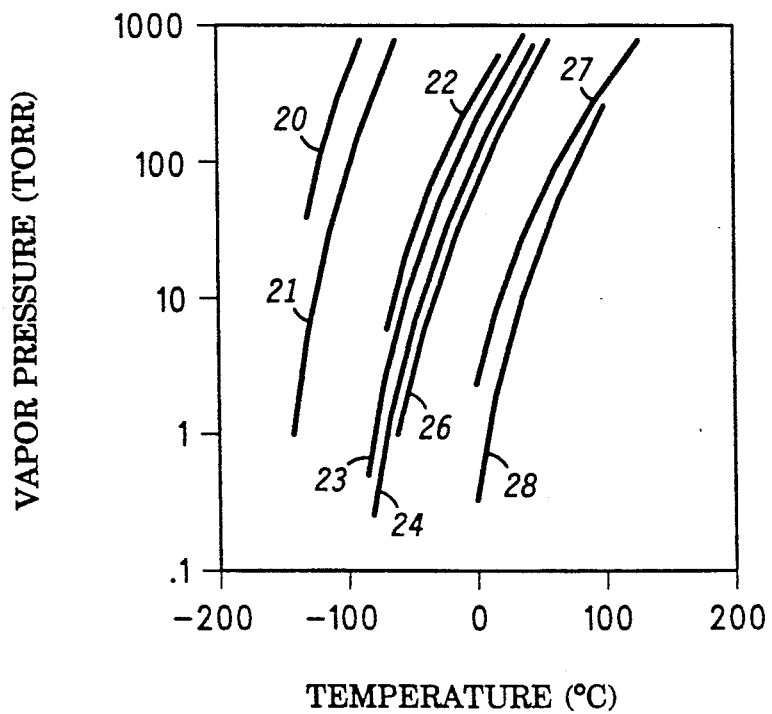
FIG. 2 is a graph of vapor pressure versus temperature for common methane and hydrogen etch products.

FIG. 2 is a vapor pressure versus temperature graph for common etch products using etch chemistries of methane and hydrogen. Etching of indium, aluminum, silicon, and gallium in methane and hydrogen chemistry yields major etch products of which their vapor pressure versus temperature curves are shown in FIG. 2. These etch products are trimethylindium represented by curve 28, trimethylaluminum represented by curve 27, tetramethylsilicane (or tetramethylsilane) represented by curve 22, and trimethylgallium represented by curve 26 respectively. Etching of arsenic and phosphorus in methane and hydrogen chemistry both yield two major etch products each. Vapor pressures for arsenic etch products are shown as trimethylarsine represented by curve 24 and arsine represented by curve 21. Vapor pressures for phosphorus etch products are shown as trimethylphosphine represented by curve 23 and phosphine represented by curve 20. It should be understood that etching of materials such as gallium arsenide have been separated and are represented as single etch products. Using one torr as a standard vapor pressure to examine relative vapor pressures of etch products, it can be seen that more volatile (lower temperature) etch products are found on the left hand side of the graph whereas, less volatile (higher temperature) etch products are found on the right hand side of the graph.

Directly comparing FIG. 1 and FIG. 2 it is quite evident that there is a significant increase in volatility of all etch products that are shown with the use of methane and hydrogen plasma chemistry instead of chlorine plasma chemistry. Use of a methane and hydrogen plasma chemistry allows for a vapor pressure at a lower temperature. This greater vapor pressure enables removal of etch products more quickly which enhances the etch of the semiconductor substrate. For example, in FIG. 1 products of aluminum require approximately 100 degrees Celsius for a one torr vapor pressure to be developed, whereas in FIG. 2, a one torr vapor pressure for aluminum etch products requires a temperature of approximately minus 10 degrees Celsius. This increase in volatility is extremely important because it provides for rapid removal of etch products. Additionally, volatility of indium etch products shift from a temperature of approximately 310 degrees Celsius to approximately 0 degrees Celsius. Thus an overall increase in volatility of etch products is obtained by using methane and hydrogen.

Using the trialkylboron gas in a plasma increases the number density of reactive methyl radicals which are compatible with basic methane and hydrogen plasma gas chemistry. Additionally, there is an increase in the number density of alkylboron ions, in particular dialkylboron ions, involved in an ion bombardment mechanism associated with reactive ion etching (RIE). By way of example, addition of trialkylboron into a methane and hydrogen plasma causes several benefits. It is believed that these benefits are caused by a generation of reactive species which are compatible with basic methane and hydrogen etch chemistry. Generation of reactive methyl radicals and dialkylboron ions are formed in the plasma. As a result of forming methyl radicals, an increased number density of reactive species is now available in the plasma. Additionally, an increase in ion bombardment is caused by the increased number density of dialkylboron ions that are present in the plasma. Further, dialkylboron ions are presumed to exist longer in the plasma, thereby, allowing them to have a greater potential to become involved in an ion bombardment reaction. It should be understood that etching with trimethylboron as an additive is preferred but, that other trialkylborons can also be used such as triethylboron. It also is believed that this chemistry effects the etching of materials by increasing rate constants $k_1$ and $k_2$ in the generalized equation. This in effect increases the generation of reactive etch species and increases the number of sites for chemisorption. By increasing these rate constants and the volatility of etch products removal or etch rates of bulk material is increased.

Etch initiation or delay times are reduced by using trialkylboron or the like as an additive gas to a methane and hydrogen plasma. Etch initiation time is the time it takes to begin etching bulk material from when a plasma is generated until bulk material is beginning to be removed. This time is generally dependent on two factors. First, oxides that are present on the bulk material have to be removed. These oxides are usually formed upon exposure to atmosphere. Oxides are generally very stable materials and need to be removed before etching of the bulk material can begin. Second, interfering reactions have to be suppressed or limited. These reactions can be a whole array of reactions that do not specifically participate in the etching of the desired material. By way of example, reactions with water molecules retained on surfaces of the reaction chamber would interfere with the desired etching of the substrate. Involvement of desorbed water from the reaction chamber also forms reactive oxygen which forms additional oxide on the substrate that is desired to be etched. These two problems are believed to be resolved by aggressive scavenging of oxygen found in metal oxides and water vapor by trialkylboron. It is also believed that the aggressive scavenging is caused by an electron deficient nature of boron and a Lewis acid/base interaction. Additionally, a more uniform etch result is derived by a rapid removal of oxides and water. Reduction in etch initiation time is believed to be caused by trialkylboron scavenging of water vapor originating from the reactor surfaces and oxygen found in the form of metal oxides.

Corrosion of metal or metalloid features ceases to be a problem with the use of methane, hydrogen, and trialkylboron generated plasmas. Plasmas generated with methane, hydrogen, and trialkylboron do not corrode metals or metalloids because methane, hydrogen, and trialklyboron are not inherently corrosive.

It is believed that accelerated etch rates are derived from the addition of trialklyboron since a greater number density of stable ions are formed. This greater number of stable ions or etch species lends itself to greater ion enhanced adsorption and ion enhanced reactions. Additionally, reactive species generated from either trimethylboron or triethylboron have a greater ion bombardment capability due to a greater momentum caused by a larger molecule size.

A preferred method of plasma etching semiconductor substrates uses a reactive ion etch system. It should be understood that other systems could be used to expose semiconductor substrates to a plasma having hydrogen, methane, and trialkylboron. Semiconductor substrates are placed into a reactor. Gases are allowed to flow into the reactor and the plasma is generated. Temperature ranges of the semiconductor substrates are kept nominally between $-100$ to $+500$ degrees Celsius with an optimum temperature of 50 degrees Celsius. Pressure ranges are kept nominally between 1 millitorr to 200 millitorr with an optimum pressure of 60 millitorr. Power ranges are kept nominally between 0.1 watt per centimeter squared to 5 watts per centimeter squared with an optimum power of 1 watt per centimeter squared. Hydrogen gas is nominally regulated to a range of 1 to 90 percent by volume with an optimum of 45 percent. Methane gas is nominally regulated to a range of 1 to 10 percent by volume with an optimum of 5 percent. Trialkylboron gas is nominally regulated to a range of 1 to 50 percent by volume with an optimum of 25 percent. It should be understood that addition of a nonreactive gas such as argon, helium, krypton, xenon, nitrogen can be used for dilution purposes or making up a balance of total gas volume. It should be further understood that parameters change from system to system depending upon application and system configuration.

By now it should be appreciated that there has been provided an improved method for plasma etching of silicon, metals, and III-V or metalloid semiconductor substrates. This method allows for the etching of these materials in a noncorrosive environment so as to prevent corrosion as a failure mode of semiconductor devices. Additionally, this invention scavenges oxygen from metal oxides and removes water which improves etch performance. Improved volatility, etch rate, and reduced etch initiation times, are provided for in a noncorrosive plasma.

We claim:

1. A method for plasma etching semiconductor substrates comprising the steps of:
    mounting the semiconductor substrate in a plasma reactor; and
    exposing the semiconductor substrate to a gas plasma comprising methane, hydrogen, and trialkylboron.

2. The method of claim 1 further including plasma etching substrates gallium arsenide, indium phosphide, aluminum gallium arsenide, indium gallium aluminum arsenide, and indium gallium aluminum phosphide, and gallium phosphide.

3. The method of claim 1 further including substituting trimethylboron or triethylboron for trialkylboron.

4. The method of claim 1 further including etching a metal on the semiconductor substrates that is composed of aluminum or its alloys.

5. The method of claim 1 further including generating the gas plasma in a reactive ion etch system.

6. The method of claim 1 further including maintaining the semiconductor wafer substrate within a temperature range between −100 degrees Celsius and +500 degrees Celsius for plasma etching.

7. The method of claim 5 further including adjusting the semiconductor wafer substrate temperature substantially to 50 degrees Celsius during the plasma etching.

8. The method of claim 1 further including maintaining a plasma pressure in a reactor in a range of 1 millitorr to 200 millitorr for plasma etching.

9. The method of claim 8 further including adjusting the pressure of the reactor substantially to 60 millitorr for the plasma etching.

10. The method of claim 1 further including maintaining a percent by volume of gases comprising of 1 to 10 percent methane, 1 to 90 percent hydrogen, 1 to 50 percent of at least one of trialkylboron, trimethylboron, or triethylboron.

11. A method for enhancing etch rates of a semiconductor substrate in a plasma reactor comprising:
    placing the semiconductor substrate in the plasma reactor;
    flowing a gas mixture having methane, hydrogen, and trialkylboron into the plasma reactor; and
    generating a plasma with said gas mixture.

12. The method of claim 11 further including substituting trimethylboron or triethylboron for trialkylboron.

13. A method for removal of oxygen and water vapor from a semiconductor substrate and surfaces contained inside a plasma reactor comprising:
    providing at least one of trialkylboron, trimethylboron, or triethylboron gas to a plasma gas mixture in the reactor; and
    generating a plasma in the reactor.

14. A method for enhancing the volatility of etch products from metal or metalloid containing semiconductor substrates comprising:
    placing the metal or metalloid containing semiconductor substrate in a plasma reactor;
    generating a plasma comprised of methane, hydrogen, and at least one of trialkylboron, trimethylboron, or triethylboron; and
    exposing the metal or metalloid containing semiconductor substrate to said plasma.

15. The method of claim 14 further including etching semiconductor substrates of III-V compound materials.

16. The method of claim 14 further including etching a metal on the semiconductor substrates that is composed of aluminum or its alloys.

* * * * *